(12) United States Patent
Choi

(10) Patent No.: US 7,956,650 B2
(45) Date of Patent: *Jun. 7, 2011

(54) INPUT CIRCUIT OF SEMICONDUCTOR INTEGRATED CIRCUIT

(75) Inventor: Hong Sok Choi, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/726,079

(22) Filed: Mar. 17, 2010

(65) Prior Publication Data

US 2010/0182051 A1    Jul. 22, 2010

Related U.S. Application Data

(63) Continuation of application No. 11/964,792, filed on Dec. 27, 2007, now Pat. No. 7,705,634.

(30) Foreign Application Priority Data

Jun. 27, 2007 (KR) .................. 10-2007-0063835

(51) Int. Cl.
*H03K 5/22* (2006.01)
(52) U.S. Cl. .................................... 327/66; 327/298
(58) Field of Classification Search ................ None
See application file for complete search history.

(56) References Cited

U.S. PATENT DOCUMENTS

| 5,621,340 | A | 4/1997 | Lee et al. |
| 5,963,064 | A | 10/1999 | Toyota et al. |
| 6,081,477 | A | 6/2000 | Li |
| 6,807,108 | B2 | 10/2004 | Maruyama et al. |
| 7,092,263 | B2 | 8/2006 | Chang |
| 7,126,419 | B2 | 10/2006 | Miyasita |
| 7,358,776 | B2 | 4/2008 | Matsumoto |
| 7,705,634 | B2 * | 4/2010 | Choi ................ 327/65 |
| 2006/0208787 | A1 | 9/2006 | Callahan |
| 2007/0002644 | A1 | 1/2007 | Kang |

FOREIGN PATENT DOCUMENTS

| JP | 2003347860 | 12/2003 |
| KR | 1019940006343 | 3/1994 |
| KR | 1020060022979 | 3/2006 |

* cited by examiner

*Primary Examiner* — Lincoln Donovan
*Assistant Examiner* — Sibin Chen
(74) *Attorney, Agent, or Firm* — Baker & McKenzie LLP

(57) ABSTRACT

An input circuit is disclosed. The input circuit can include a cross voltage generating block that can be configured to perform charge-sharing on a pair of input signals whose phases are opposite to each other and generate a cross voltage, and an input buffer block that can be configured to buffer the pair of input signals at a voltage level corresponding to a voltage level of the cross voltage and generate an output signal.

15 Claims, 5 Drawing Sheets

INPUT CIRCUIT OF SEMICONDUCTOR INTEGRATED CIRCUIT

CROSS-REFERENCES TO RELATED APPLICATION

This application is a continuation application of U.S. application Ser. No. 11/964,792 which was filed Dec. 27, 2007 which claims priority under 35 U.S.C. 119(a) to Korean Patent Application number 10-2007-0063835, filed on Jun. 27, 2007, in the Korean Intellectual Property Office, the contents of which are incorporated herein by reference as if set forth in full.

BACKGROUND

1. Technical Field

The embodiments described herein relate to a semiconductor integrated circuit, and more particularly, to an input circuit of a semiconductor integrated circuit.

2. Related Art

Generally, in a semiconductor integrated circuit (e.g., a semiconductor memory apparatus) a signal that is input from outside the semiconductor memory apparatus is first applied to an input buffer block where it is buffered at a voltage level that is used in the semiconductor memory apparatus.

As shown in FIG. 1, a conventional input buffer block 100 can be configured to be activated/deactivated by an enable signal "ENABLE." The input buffer block 100 can be configured to receive a clock signal "CLK" as a first input signal and a clock bar signal "CLKB" as a second input signal, buffer the first and second input signals, and generate an output signal "CKOUT."

That is, when a voltage level of the clock signal "CLK" is higher than that of the clock bar signal "CLKB," a second NMOS transistor N2 can be turned off, and a first NMOS transistor (N1) can be turned on. Thus, the output signal "CKOUT" has a voltage level at a "high" level. Meanwhile, when a voltage level of the clock bar signal "CLKB" is higher than that of the clock signal "CLK," the first NMOS transistor (N1) can be turned off, the second NMOS transistor (N2) can be turned on, and the first PMOS transistor (P1) and the second PMOS transistor (P2) can both be turned on. If the first PMOS transistor (P1) is turned on, the output signal "CKOUT" becomes a voltage level at a "low" level.

FIG. 2 is a timing diagram illustrating a waveform of an input buffer block shown in FIG. 1. Referring to FIG. 2, generally, an average voltage level of the pair of input signals "CLK" and "CLKB" whose phases are opposite to each other, must be the same as a cross voltage (Vcross) of the input signals "CLK" and "CLKB."

Assuming that a cross voltage (Vcross) required in a data sheet is a reference voltage (Vref), then when a voltage level of the cross voltage (Vcross) is the same as a voltage level of the reference voltage (Vref), the input buffer block can have a normal output signal "CKOUT" that has a constant delay time.

FIG. 3 is a timing diagram illustrating an output signal "CKOUT" when a cross voltage (Vcross) of a clock signal "CLK" and a clock bar signal "CLKB" is higher than a reference voltage (Vref).

In general, the input buffer block 100 is typically configured to operate when a signal having the same cross voltage (Vcross) as the reference voltage (Vref) is input. However, as shown in FIG. 3, when the cross voltage (Vcross) is higher than the reference voltage (Vref), a voltage level at a first node (Nd1) of FIG. 1 can become lower than a normal voltage level of a "low/high" level.

For example, if a phase of the clock signal "CLK" is inverted from "high" to "low" and a phase of the clock bar signal "CLKB" is inverted from "low" to "high", the voltage level at the first node (Nd1) can be inverted from the "low" level to the "high" level. However, since the first node (Nd1) has a voltage level lower than a normal low level, an inversion time can be extended. At that time, the inversion time becomes a delay time. For this reason, a falling time of the output signal "CKOUT" can be delayed.

SUMMARY

An input circuit that can perform a stable operation even though a cross voltage (Vcross) of a pair of input signals does not fall within a reference voltage range is described herein.

In one aspect, an input circuit includes a cross voltage generating block that can be configured to perform charge-sharing on a pair of input signals whose phases are opposite to each other and generate a cross voltage and an input buffer block that can be configured to buffer the pair of input signals at a voltage level corresponding to a voltage level of the cross voltage to generate an output signal.

In another aspect, an input circuit includes an input buffer block that can be configured to buffer a pair of input signals whose phases are opposite to each other and generates an output signal, a cross voltage generating block that can be configured to perform charge sharing on the pair of input signals to generate a cross voltage, a first buffer control block that can be configured to compare the cross voltage with a first reference voltage and control the input buffer block, and a second buffer control block that can be configured to compare the cross voltage with a second reference voltage and control the input buffer block.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
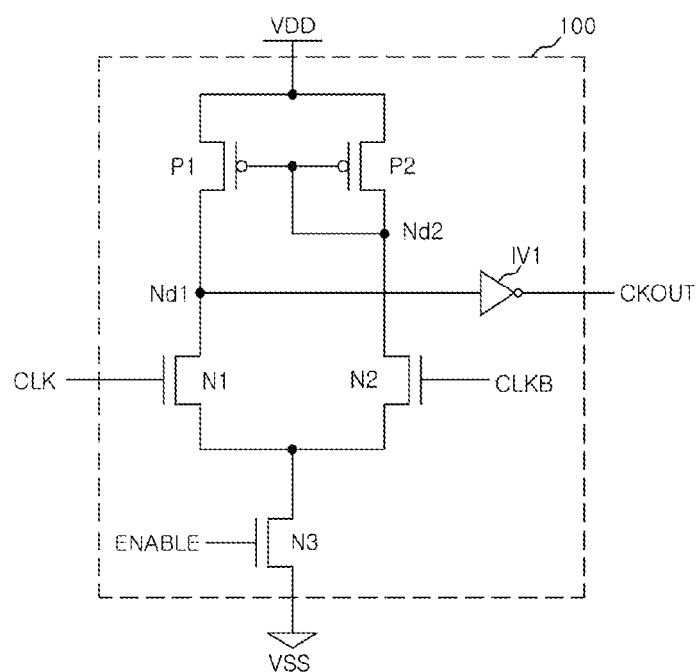
FIG. 1 is a circuit diagram illustrating an exemplary input circuit.
Figure 2:
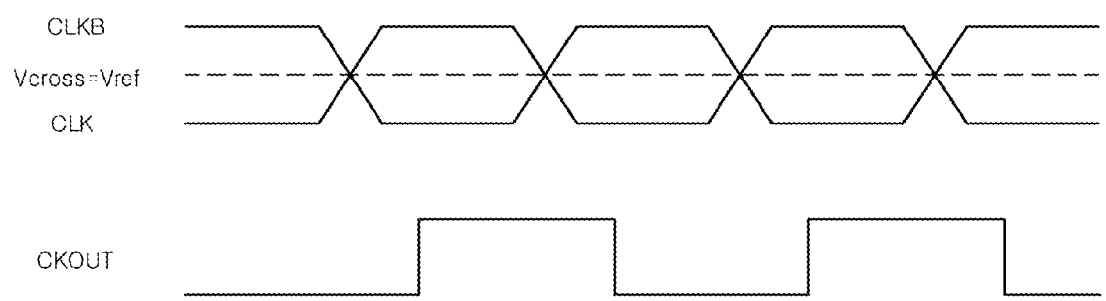
FIG. 2 is a timing diagram illustrating the ideal operation of the circuit illustrated in FIG. 1.
Figure 3:
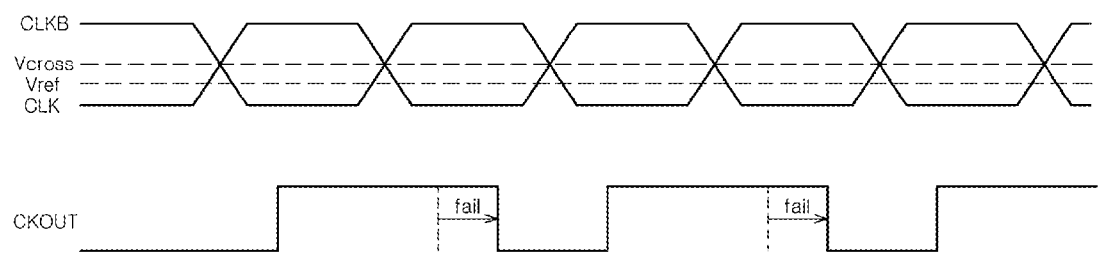
FIG. 3 is a timing diagram illustrating the operation of the circuit of FIG. 1 when an error occurs.
Figure 4:
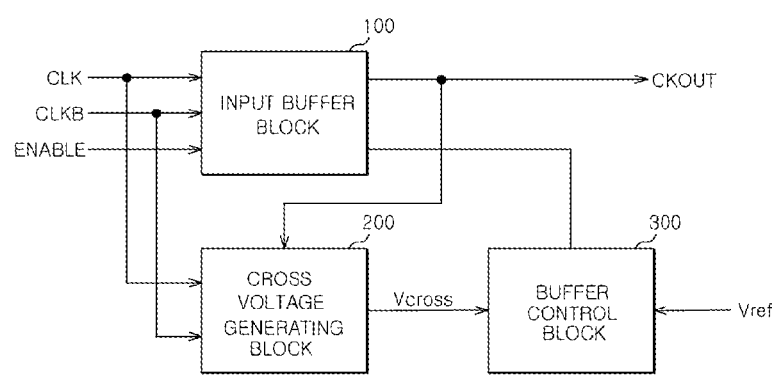
FIG. 4 is a block diagram illustrating an example input circuit, in accordance with one embodiment.
Figure 5:
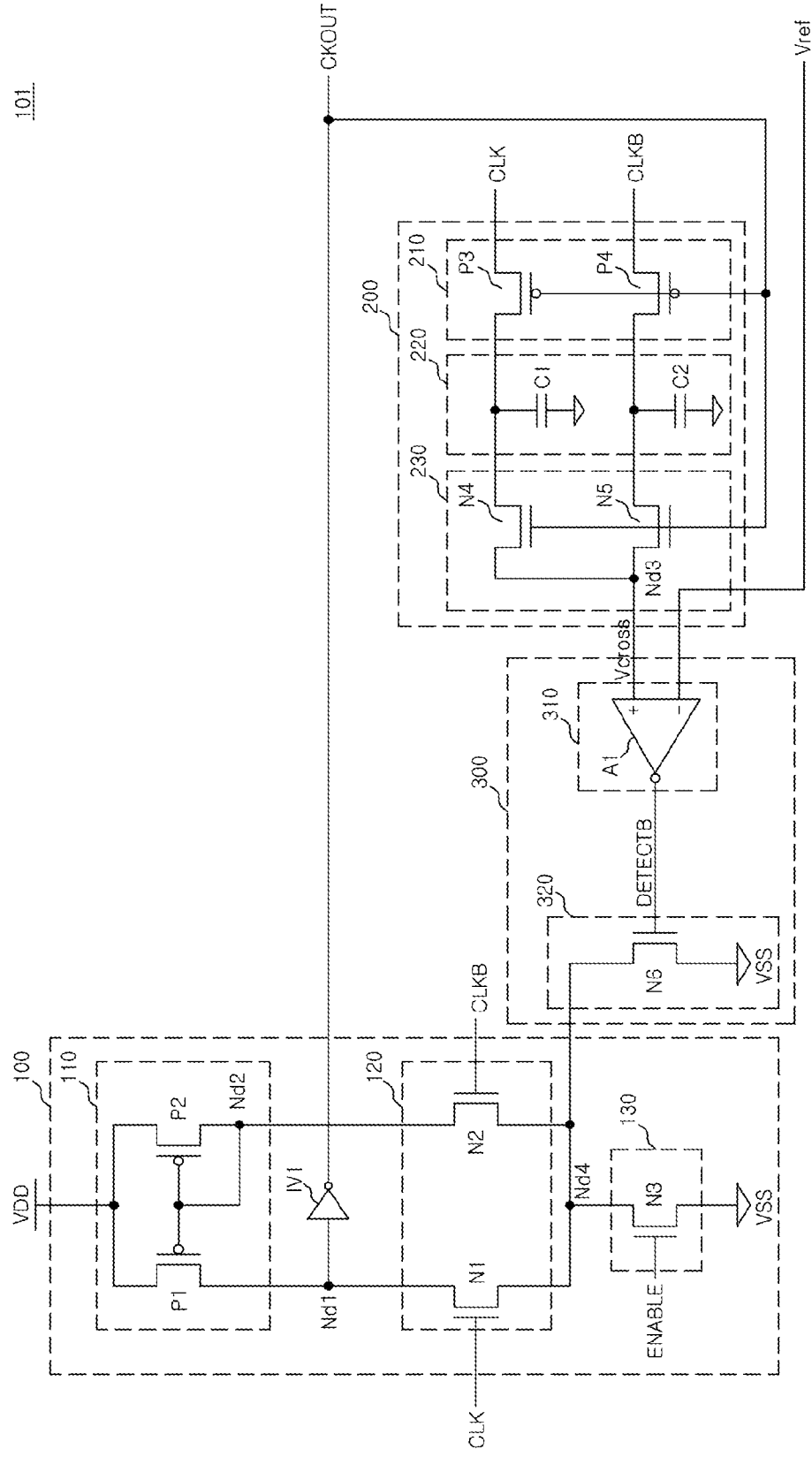
FIG. 5 is a circuit diagram illustrating the input circuit shown in FIG. 4, in accordance with one embodiment.

FIGS. 4 and 5 illustrate an example input circuit 101 configured in accordance with one embodiment. Referring to FIGS. 4 and 5, the input circuit 101 can include an input buffer block 100, a cross voltage generating block 200, and a buffer control block 300.

The input buffer block 100 can be configured to receive input signals "CLK" and "CLKB," buffer them, and generate an output signal "CKOUT."

The output signal "CKOUT" can be fed back to the cross voltage generating block 200. The cross voltage generating block 200 can be configured to receive input signals "CLK" and "CLKB." The buffer control block 300 can be configured to receive a cross voltage (Vcross) that can be generated by the cross voltage generating block 200. Even though a voltage level of the input signals "CLK" and "CLKB" exceeds a reference range, the buffer control block 300 can be configured to control the input buffer block 100 such that the output signal "CKOUT" can have a voltage level within the reference range.

It should be appreciated, however, that although the clock signal "CLK" and the clock bar signal "CLKB" are exemplified as the input signals in this embodiment, but the embodiments described herein are not limited thereto. A pair of input signals, whose phases are opposite to each other, can also be used as the input signals, in addition to the clock signal "CLK" and the clock bar signal "CLKB."

The cross voltage generating block 200 can be configured to perform charge sharing on the input signals "CLK" and "CLKB" to generate the cross voltage (Vcross). The cross voltage generating block 200 can include a transmitting unit 210, a storage unit 220, and an output unit 230.

In response to the output signal "CKOUT," the transmitting unit 210 can be configured to transmit the input signals "CLK" and "CLKB" to the storage unit 220. The transmitting unit 210 can include a third PMOS transistor (P3) and a fourth PMOS transistor (P4). A gate of the third PMOS transistor (P3) can be configured to receive the output signal "CKOUT," one of a source and a drain thereof can receive the clock signal "CLK," and the other of the source and the drain thereof can be connected to storage unit 220. A gate of the fourth PMOS transistor (P4) can be configured to receive the output signal "CKOUT," one of a source and a drain can receive the clock bar signal "CLKB," and the other of the source and the drain can be connected to storage unit 220.

The storage unit 220 can be configured to temporarily store the input signals "CLK" and "CLKB" that are transmitted by transmitting unit 210. The storage unit 220 can include a first capacitor (C1) and a second capacitor (C2). The first capacitor (C1) has one end that can be connected to the transmitting unit 210 and the output unit 230, and another end that can be connected to a ground terminal. The second capacitor (C2) can have one end that is connected to the transmitting unit 210 and the output unit 230, and another end that is connected to the ground terminal.

In response to the output signal "CKOUT," the output unit 230 can be configured to perform charge sharing on the input signals "CLK" and "CLKB" that is stored in the storage unit 220, and output cross voltage (Vcross).

The output unit 230 can include a fourth NMOS transistor (N4) and a fifth NMOS transistor (N5). A gate of the fourth NMOS transistor (N4) can be configured to receive the output signal "CKOUT," one of a source and a drain thereof can be connected to the storage unit 220, and the other of the source and the drain thereof can be connected to the buffer control block 300. A gate of the fifth NMOS transistor (N5) can be configured to receive the output signal "CKOUT," one of a source and a drain thereof can be connected to the storage unit 220, and the other of the source and the drain thereof can be connected to the buffer control block 300.

The buffer control block 300 can be configured to compare the cross voltage (Vcross) with the reference voltage (Vref) and generate a detection signal "DETECTB." The buffer control block 300 can include a comparing unit 310 and a sink unit 320.

The comparing unit 310 can be configured to compare the cross voltage (Vcross) with the reference voltage (Vref) and output detection signal "DETECTB." The comparing unit 310 can be composed of a comparator (A1) that can be configured to receive the cross voltage (Vcross) and the reference voltage (Vref) and output the detection signal "DETECTB."

The sink unit 320 can be configured to sink a voltage generated at the input buffer block 100 in response to the detection signal "DETECTB" output by the comparing unit 310. The sink unit 320 can be composed of a sixth NMOS transistor (N6) whose gate can receive the detection signal "DETECTB" and whose source/drain can be connected between a ground terminal and the input buffer block 100.

The input buffer block 100 can include a current mirror unit 110, an input unit 120, and an enable unit 130.

The current mirror unit 110 can be connected between a voltage source (VDD) and the input unit 120 and can be configured to perform a current mirroring operation.

The input unit 120 can be connected between the current mirror unit 110 and the enable unit 130, and receive the input signals "CLK" and "CLKB."

The enable unit 130 can be located between the input unit 120 and the ground terminal and can be configured to enable or disable the input buffer block 100. The input buffer block 100 can be a known structure of an input buffer, and the sink unit 320 of the buffer control block 300 can be connected to a fourth node (N4) to which the input unit 120 and the enable unit 130 are connected.

The operation of an input circuit 101 in accordance with one embodiment will now be described with reference to FIG. 5.

The input buffer block 100 can be configured to start the operation when the enable unit 130 is activated. Then, when the voltage level of the clock signal "CLK" is higher than the voltage level of the clock bar signal "CLKB," the output signal can have a voltage level at a "high" level. Meanwhile, when the voltage level of the clock bar signal "CLKB" can be higher than the voltage level of the clock signal "CLK," the output signal "CKOUT" can have a voltage level at a "low" level. The output signal "CKOUT" that is output from the input buffer block 100 can be fed back to the cross voltage generating block 200. If the fed-back output signal "CKOUT" has a voltage level at a "high" level, the third PMOS transistor (P3) and the fourth PMOS transistor (P4) of the transmitting unit 210 can be turned on. Thus, the clock signal "CLK" and the clock bar signal "CLKB" can be stored in the first capacitor (C1) and the second capacitor (C2) of the storage unit 220, respectively.

If the voltage level of the output signal "CKOUT" is inverted to a "low" level, the third PMOS transistor (P3) and the fourth PMOS transistor (P4) of the transmitting unit 210 can be turned off, and the fourth NMOS transistor (N4) and the fifth NMOS transistor (N5) of the output unit 230 can be turned on. Therefore, charges that are respectively stored in the first capacitor (C10 and the second capacitor (C2) of the storage unit 220 can be transmitted to a third node (Nd3), thereby allowing sharing of the charges. As such, the voltage that is generated at the third node (Nd3) can become the cross voltage (Vcross).

The comparing unit 310 of the buffer control block 300 can be configured to compare the cross voltage (Vcross) with the reference voltage (Vref) and output the detection signal "DETECTB." At this time, when the cross voltage (Vcross) that is applied to the third node (Nd3) is higher than the reference voltage (Vref), the detection signal "DETECTB" can be enabled. In contrast, when the cross voltage (Vcross) is lower than the reference voltage (Vref), the detection signal "DETECTB" can be disabled. The sink unit 320 can be configured to control the input buffer block 100 utilizing detection signal "DETECTB." That is, when the detection signal "DETECTB" is enabled, the sixth NMOS transistor (N6) of the sink unit 320 can be turned off, which increases a voltage level of a "low/high" level at the first node (Nd1) of the input buffer block 100, and decreases the amount of delay time of when a voltage level of a "low" level is inverted to a voltage level of a "high" level. As a result, a falling time error of the output signal "CKOUT" can be removed, thereby enabling normal output.

In this case, the buffer control block 300 can be configured to prevent the cross voltage (Vcross) from becoming higher than the reference voltage (Vref) and remove the falling time error of the output signal "CKOUT." However, the voltage level of the reference voltage (Vref) can be set to be lower than the voltage level of the cross voltage (Vcross), and thus, the cross voltage (Vcross) can be prevented from becoming lower than the reference voltage (Vref). In this way, the rising time error of the output signal "CKOUT" can also be removed by the above-described circuit structure.

Figure 6:
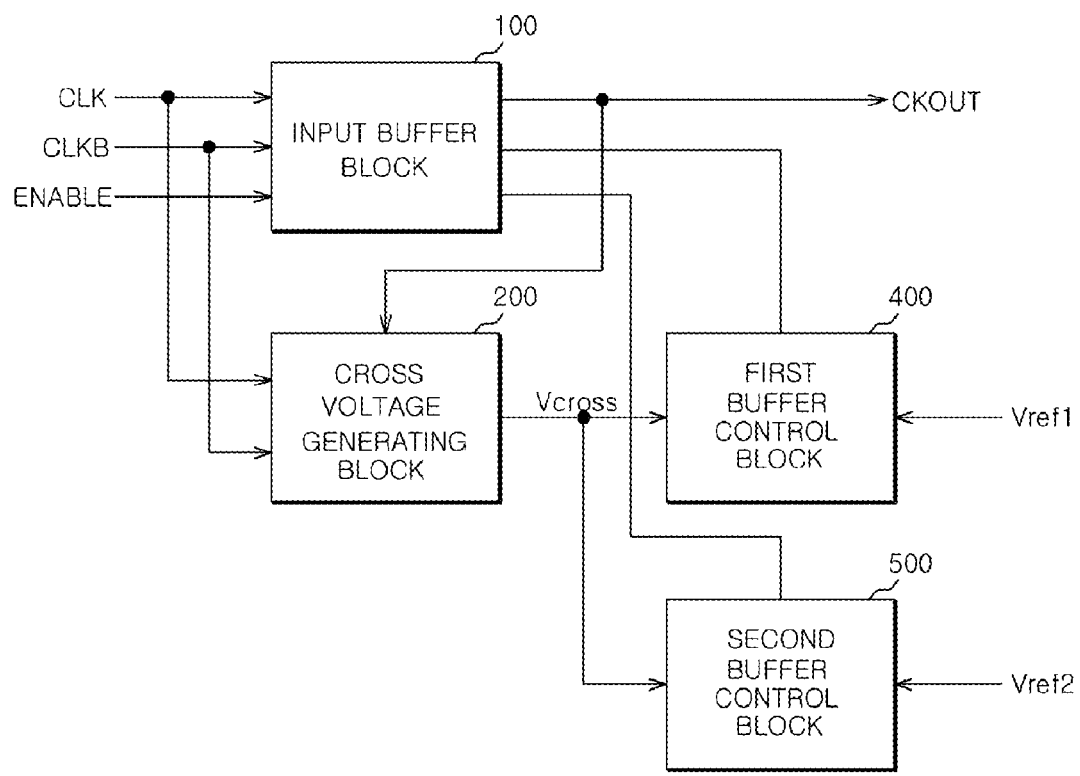
FIG. 6 is a block diagram illustrating another example input circuit, in accordance with one embodiment.

FIG. 6 is a block diagram illustrating an input circuit 102, in accordance with one embodiment.

Referring to FIG. 6, the input circuit 102 can include an input buffer block 100, a cross voltage generating block 200, a first buffer control block 400, and a second buffer control block 500.

The input buffer block 100 and the cross voltage generating block 200 can have the same circuit structure as those in the FIG. 5. The first buffer control block 400 can include the same circuit structure as the buffer control block 300 according to the FIG. 5, except that a first reference voltage (Vref1) can be the input.

The second buffer control block 500, that is additionally provided in accordance with another embodiment and supplied with the cross voltage (Vcross) that is generated by the first buffer control block 400, can be configured to compare the cross voltage (Vcross) with the second reference voltage (Vref2) and control the input buffer block 100 according to the results of that comparison.

In this case, the first reference voltage (Vref1) and the second reference voltage (Vref2) can have a predetermined voltage difference therebetween. The first reference voltage (Vref1) and the second reference voltage (Vref2) can be readily implemented by using arbitrary voltages that can be used in the semiconductor integrated circuit. If the cross voltage (Vcross) is out of a voltage level range between the first reference voltage (Vref1) and the second reference voltage (Vref2), the first buffer control block 400 and the second buffer control block 500 can be configured to adjust the voltage level at the node that is connected to the input buffer block 100, and perform a control operation such that the cross voltage (Vcross) is within the voltage level range between the voltage level of the first reference voltage (Vref1) and the voltage level of the second reference voltage (Vref2).

Figure 7:
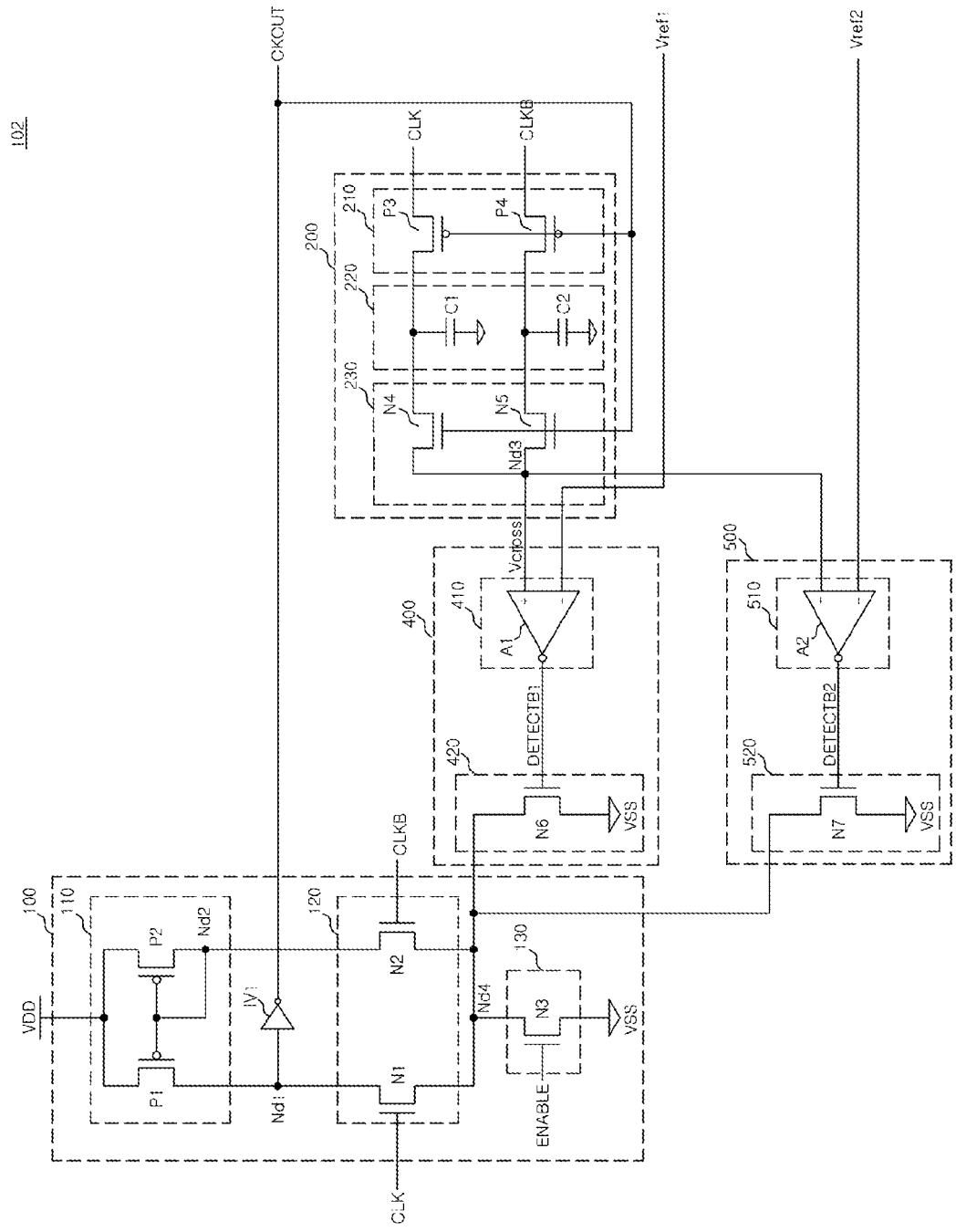
FIG. 7 is a circuit diagram illustrating the input circuit shown in FIG. 6, in accordance with one embodiment.

FIG. 7 is a circuit diagram specifically illustrating the input circuit 102 that is shown in FIG. 6. As shown in FIG. 7, each of the input buffer block 100 and the first buffer control block 400 can have a general type. A signal that is generated by a comparing unit 410 of the first buffer control block 400 can be represented as a first detection signal "DETECTB1."

The second buffer control block 500 can include a comparing unit 510 and a sink unit 520. In this case, the comparing unit 510 can be configured to compare the cross voltage (Vcross) with the second reference voltage (Vref2) and generate a second detection signal "DETECTB2." The sink unit 520 can be configured to sink the input buffer block 100 in response to the second detection signal "DETECTB2."

In this case, the comparing unit 510 can include a comparator (A2). The sink unit 520 can be composed of a seventh NMOS transistor (N7) that can have a gate receiving the second detection signal "DETECTB2" and a source/drain that is connected between the input buffer block 100 and a ground terminal.

When the first reference voltage (Vref1) has a voltage level higher than that of the second reference voltage (Vref2), the cross voltage (Vcross) can have a voltage level between the first reference voltage (Vref1) and the second reference voltage (Vref2) during a normal operation of the input buffer block 100. At this time, the sixth NMOS transistor (N6) that is included in the sink unit 420 of the first buffer control block 400 can be turned on, and the seventh NMOS transistor (N7) that is included in the sink unit 520 of the second buffer control block 500 can be turned off.

Meanwhile, if the voltage level of the output signal "CKOUT" increases and the voltage level of the cross voltage (Vcross) exceeds the voltage level of the first reference voltage (Vref1), the sixth NMOS transistor (N6) can be turned off. The voltage that sinks from the input buffer block 100 can get lower and the amount of current that flows through the first PMOS transistor (P1) and the second PMOS transistor (P2) can be decreased. As a result, the voltage level of the output signal "CKOUT" can get lower again.

In contrast, if the voltage level of the output signal "CKOUT" gets lower and the voltage level of the cross voltage (Vcross) becomes lower than the voltage level of the second reference voltage (Vref2), the sixth NMOS transistor (N6) and the seventh NMOS transistor (N7) can be turned on. Accordingly, the voltage that sinks from the input buffer block 100 can get higher and the amount of current that flows through the first PMOS transistor (P1) and the second PMOS transistor (P2) can be increased. Thus, the voltage level of the output signal "CKOUT" can increase again.

That is, in the input circuit according to this embodiment, it can be determined whether the voltage level of the output signal is out of a voltage level range between the voltage level of the first reference voltage and the voltage level of the second reference voltage. As a result, it is possible to immediately correct an erroneous operation of the input buffer block. Therefore, it is possible to apply a stable buffering operation for an input signal.

As described above, the input circuit according to various embodiments can be configured to generate the cross voltage of the input signal pair. When the cross voltage is out of a voltage range that is defined by the reference voltage, the input circuit can be configured to control the input buffer block through the buffer control block such that the output value is not delayed at a falling time, thereby preventing an error from occurring.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An input circuit comprising:
   a cross voltage generating block that performs charge-sharing on a pair of input signals whose phases are opposite to each other and generates a cross voltage, wherein the cross voltage is a voltage having a level corresponding to a cross point of the pair of input signals;

an input buffer block that buffers the pair of input signals so that the pair of the input signals has a voltage level corresponding to a level of the cross voltage, to generate an output signal; and a buffer control block that compares the cross voltage with a reference voltage and sinks the output signal of the input buffer block according to a comparing result, wherein the cross voltage generating block receives the output signal of the input buffer block as a control signal.

2. The input circuit of claim 1, wherein the cross voltage generating block includes:

a transmitting unit that receives the input signals and transmits the input signals;

a storage unit that stores the transmitted input signals; and an output unit that performs charge sharing on the stored input signals and outputs the cross voltage.

3. The input circuit of claim 1, wherein the input buffer block is configured to lower a voltage of the output signal, when the voltage level of the cross voltage exceeds a voltage level of a reference voltage.

4. The input circuit of claim 3, wherein the input buffer block includes:

a current mirror unit that is supplied with a driving voltage and performs a current mirroring operation;

an input unit that is connected to the current mirror unit and receives the input signals; and an enable unit that is connected between the input unit and a ground terminal, and controls the operation of the input buffer block.

5. The input circuit of claim 1, wherein the buffer control block includes:

a comparing unit that compares the cross voltage and the reference voltage to output a detection signal as the comparing result; and a sink unit that generates an output signal for sinking a voltage level of a connection node between the input unit and the enable unit in response to the detection signal, wherein the output signal of the input buffer is controlled by sinking the voltage level of the connection node.

6. An input circuit comprising:

an input buffer block that buffers a pair of input signals whose phases are opposite to each other and generates an output signal;

a cross voltage generating block that performs charge sharing on the pair of input signals and generates a cross voltage, wherein the cross voltage is a voltage having a level corresponding to a cross point of the pair of input signals;

a first buffer control block that compares the cross voltage and a first reference voltage and controls the input buffer block; and a second buffer control block that compares the cross voltage with a second reference voltage and controls the input buffer block, wherein the cross voltage generating block receives the output signal of the input buffer block as a control signal, and the first reference voltage is higher than the second reference voltage.

7. The input circuit of claim 6, wherein the cross voltage generating block includes:

a transmitting unit that receives the input signals and transmits the input signals;

a storage unit that stores the transmitted input signals; and an output unit that performs charge sharing on the stored input signals and outputs the cross voltage.

8. The input circuit of claim 7, wherein when a voltage level of the cross voltage becomes higher than a voltage level of the first reference voltage, the first buffer control block controls the input buffer block to lower a voltage of the output signal.

9. The input circuit of claim 8, wherein the first buffer control block includes:

a comparing unit that compares the cross voltage and the first reference voltage and generates a first detection signal; and a first sink unit that operates in response to the first detection signal and is connected between the input unit and the enable unit.

10. The input circuit of claim 7, wherein, when a voltage level of the cross voltage becomes lower than a voltage level of the second reference voltage, the second buffer control block controls the input buffer block to increase a voltage of the output signal.

11. The input circuit of claim 10, wherein the second buffer control block includes:

a second comparing unit that compares the cross voltage and the second reference voltage and generates a second detection signal; and a second sink unit that operates in response to the second detection signal and is connected between the input unit and the enable unit in response to the second detection signal.

12. The input circuit of claim 9, wherein the first buffer control block includes:

a first comparing unit that compares the cross voltage and the first reference voltage and generates a first detection signal; and a first sink unit that sinks the input buffer block in response to the first detection signal, and wherein the first reference voltage is higher than the second reference voltage.

13. The input circuit of claim 12, wherein when the voltage level of the cross voltage is within a voltage level range between the voltage level of the first reference voltage and the voltage level of the second reference voltage, the first comparing unit activates the first sink unit, and the second comparing unit inactivates the second sink unit.

14. The input circuit of claim 12, wherein when the voltage level of the cross voltage is higher than the voltage level of the first reference voltage, the first comparing unit and the second comparing unit inactivate the first sink unit and the second sink unit, respectively.

15. The input circuit of claim 12, wherein when the voltage level of the cross voltage is lower than the voltage level of the second reference voltage, the first comparing unit and the second comparing unit activate the first sink unit and the second sink unit, respectively.

* * * * *